United States Patent
Steinbusch

(10) Patent No.: US 7,426,670 B2
(45) Date of Patent: Sep. 16, 2008

(54) CONNECTING MULTIPLE TEST ACCESS PORT CONTROLLERS ON A SINGLE TEST ACCESS PORT

(75) Inventor: Otto Steinbusch, Cupertino, CA (US)

(73) Assignee: NXP B.V., Eindhoven (NL)

( * ) Notice: Subject to any disclaimer, the term of this patent is extended or adjusted under 35 U.S.C. 154(b) by 92 days.

(21) Appl. No.: 10/539,104

(22) PCT Filed: Dec. 15, 2003

(86) PCT No.: PCT/IB03/05950

§ 371 (c)(1),
(2), (4) Date: Jun. 15, 2005

(87) PCT Pub. No.: WO2004/057357

PCT Pub. Date: Jul. 8, 2004

(65) Prior Publication Data

US 2006/0090110 A1 Apr. 27, 2006

Related U.S. Application Data

(60) Provisional application No. 60/435,395, filed on Dec. 20, 2002.

(51) Int. Cl.
*G06F 11/00* (2006.01)
*H04L 1/00* (2006.01)

(52) U.S. Cl. .................... 714/747; 714/727; 714/30; 714/726

(58) Field of Classification Search .......... 714/100–824
See application file for complete search history.

(56) References Cited

U.S. PATENT DOCUMENTS

| 5,627,842 | A | | 5/1997 | Bhavsar et al. |
| 6,073,254 | A | * | 6/2000 | Whetsel ................. 714/30 |
| 6,311,302 | B1 | | 10/2001 | Cassetti et al. |
| 6,385,749 | B1 | * | 5/2002 | Adusumilli et al. ......... 714/733 |
| 6,804,725 | B1 | * | 10/2004 | Whetsel ................. 710/5 |
| 6,829,730 | B2 | * | 12/2004 | Nadeau-Dostie et al. ...... 714/30 |
| 6,961,884 | B1 | * | 11/2005 | Draper ................. 714/726 |
| 6,968,408 | B2 | * | 11/2005 | Joshi et al. ............. 710/110 |
| 2002/0184562 | A1 | * | 12/2002 | Nadeau-Dostie et al. ...... 714/30 |
| 2005/0050413 | A1 | * | 3/2005 | Whetsel ............... 714/724 |

* cited by examiner

*Primary Examiner*—Jacques Louis-Jacques
*Assistant Examiner*—Guerrier Merant
(74) *Attorney, Agent, or Firm*—Peter Zawilski

(57) ABSTRACT

Multiple test access port (TAP) controllers on a single chip are accessed, while maintaining the appearance to an outside observer of having only a single test access port controller. By adding a single bit to a data register (212) of each of a plurality of TAP controllers (102, 106), along with straightforward combinational logic, the plurality of TAP controllers can be accessed without the need for additional chip pins, and without the need for additional TAP controllers. Toggling the state of the added bits in the respective data registers of the plurality of TAP controllers provides the control information for either selecting one TAP controller or daisy-chaining of the plurality of TAP controllers.

15 Claims, 4 Drawing Sheets

US 7,426,670 B2

CONNECTING MULTIPLE TEST ACCESS PORT CONTROLLERS ON A SINGLE TEST ACCESS PORT

CROSS REFERENCE TO RELATED APPLICATION

This application claims the benefit of U.S. provisional application Ser. No. 60/435,395 filed 20 Dec. 2002, which is incorporated herein by reference.

BACKGROUND OF THE INVENTION

The present invention relates generally to electronic systems, and more particularly relates to methods and apparatus for connecting multiple test access port controllers on a single integrated circuit through a single test access port.

Advances in semiconductor manufacturing technology, as well as in digital systems architecture, have resulted in the ability to design and produce larger integrated circuits incorporating much more functionality than has been possible in the past. A particular class of integrated circuits, which incorporate at least several large functional blocks to produce a high level of functionality, is referred to as System on Chip (SoC). Such SoC integrated circuits often include one or more processors along with memory for storing program code that is to be executed by the processors, and one or more circuit blocks for implementing various high-level peripheral functions. Such large, complex, and highly functional integrated circuits present many challenges in terms of design effort and testing.

In order to reduce the amount of time and effort required to design a complex integrated circuit such as a SoC, engineers often attempt to re-use functional blocks (sometimes referred to as IP cores). Indeed, many design groups maintain libraries of such pre-designed and pre-verified IP cores. To maintain the advantages of using such pre-designed and pre-verified IP cores, it is preferable to not have to modify the internal design of such cores.

In order to address the requirements for testability, a number of efforts have led to the development of test architectures, such as the JTAG specification which has been formalized by the Institute of Electrical and Electronic Engineers as IEEE Standard 1149.1 Test Access Port and Boundary Scan Architecture. Test access is provided to a whole integrated circuit, or a portion thereof, through a test access port (TAP) controller along with a variety of registers. A TAP controller may be associated with each of a plurality of large functional blocks, such as, for example, IP cores.

Some pre-designed IP cores may include TAP controllers, in other instances TAP controllers must be added to an integrated circuit design by the engineers as the one or more IP cores are included in a product design.

What is needed are methods and apparatus for accessing multiple test access port controllers on a single integrated circuit.

SUMMARY OF THE INVENTION

Briefly, embodiments of the present invention provide circuits and methods for accessing multiple test access port (TAP) controllers on a single chip, which is important for compliance with the IEEE 1149.1 Standard. Embodiments of the present invention achieve compliance by maintaining the appearance of having only a single test access port to an outside observer. By adding a single bit to a data register of each of a plurality of TAP controllers along with straightforward combinational glue logic, the plurality of TAP controllers can be accessed without the need for additional chip pins, and without the need for additional TAP controllers that are arranged in a hierarchy or master-slave combination.

DETAILED DESCRIPTION OF THE DRAWINGS

Figure 1:
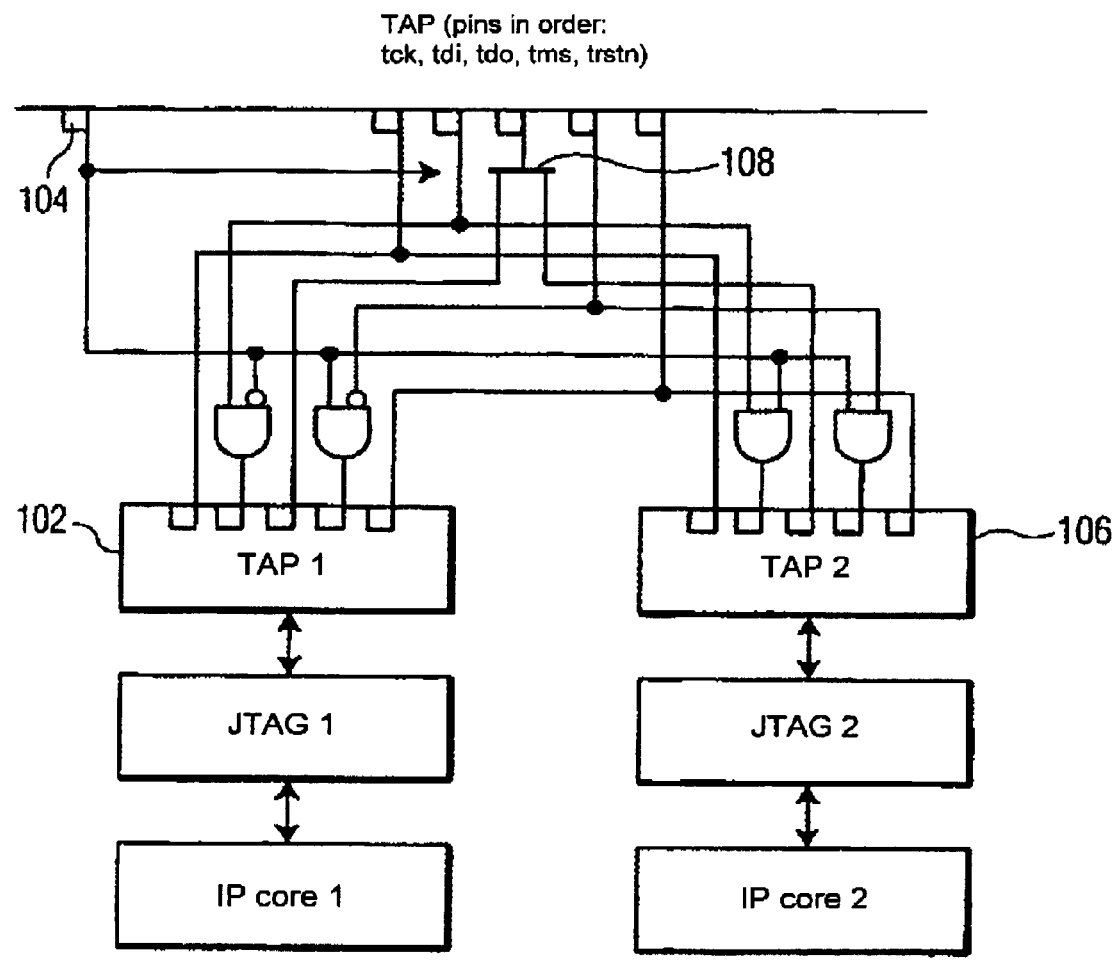
FIG. 1 is a high-level schematic block diagram of a SoC that includes a pair of IP cores, each having associated TAP controller/JTAG circuitry, and the logic and external connections for switching between each of the pair of IP cores for test access.

DESCRIPTION OF THE PREFERRED EMBODIMENTS.

When a design includes a plurality of IP cores and associated TAP controllers, it is desirable to be able to control which TAP controller is enabled communicate with an outside observer. It is also desirable to access the multiple TAP controllers while remaining compliant with the IEEE 1149 specification, and without adding additional pins to the integrated circuit. Various embodiments of the present invention allow multiple TAP controllers on a single integrated circuit to be accessed in a controlled manner through a single TAP controller by including a bit in a data register of each of the TAP controllers, along with simple combinational logic. Addition of such user data registers is allowed in accordance with the IEEE 1149 specification.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The acronym ASIC refers to Application Specific Integrated Circuit.

The expression "IP core" is context sensitive and may refer to either a design for a high-level functional block (e.g., schematic, hardware description language, netlist), or to an actual physical implementation of the high-level functional block. IP cores may include, in addition to the circuitry for implementation of the desired function, circuitry for implementation of test and debug facilities.

The acronym JTAG refers to the Joint Test Action Group. The Institute of Electrical and Electronic Engineers (IEEE) has approved IEEE Standard 1149.1, Test Access Port and Boundary Scan Architecture.

The acronym SoC refers to a System on a Chip, with SoCs being the plural of SoC.

The terms chip, semiconductor device, integrated circuit, LSI device, monolithic integrated circuit, ASIC, SoC, microelectronic device, and similar expressions are sometimes used interchangeably in this field. Microelectronic device may be considered to be the broadest term, encompassing the others. With respect to these microelectronic devices, signals are coupled between them and other circuit elements via physical, electrically conductive connections. The point of connection is sometimes referred to as an input, output, terminal, line, pin, pad, port, interface, or similar variants and combinations.

A JTAG compliant device includes pins for clock, input data, output data, and mode selection, referred to, respectively, as TCK, TDI, TDO, and TMS. TCK refers to Test Clock Input which is a terminal of the JTAG compliant device that receives a clock signal separate from the system clock. TDI refers to a Test Data In which is a terminal through which data is shifted into the JTAG compliant device. TDO refers to Test Data Out which is a terminal through which data is shifted out of the JTAG compliant device. TMS refers to Test Mode Select which is a terminal which receives data for determining which of one or more test modes in which the JTAG compliant device is to operate. A JTAG compliant device may be any type of integrated circuit such as, for example, a microprocessor, an ASIC, or a SoC. A JTAG compliant device may also include a pin to receive a low active reset signal, referred to as TRST#. JTAG compliant devices include a boundary scan register and a TAP controller. The TAP controller is a state machine that controls the JTAG functions. The boundary scan register is made up of a number of serially connected bits where each of those bits is also coupled to digital pins of the JTAG compliant device. JTAG compliant devices may also include other registers, such as, a data register, an instruction register, and a bypass register.

The logical facilities defined by the IEEE 1149.1 specification are commonly used for boundary scan testing and for system debug.

Various embodiments of the present invention provide a mechanism for accessing one or more of the multiple TAP controllers within a SoC, while maintaining compliance with the IEEE 1149.1 specification. Simple embodiments of the present invention allow a programmable switch from a default TAP controller to a second TAP controller. In this way the state of a SoC, as observed from outside the SoC, is compliant with the IEEE 1149.1 specification at start-up (i.e., after a reset has been applied to the system). More complex embodiments allow for arrangements such as switching back and forth between individual TAP controllers; and daisy-chaining all the TAP controllers together.

An application of the present invention is to provide access to multiple TAP controllers on a single chip while complying with the standard set forth in the IEEE 1149.1 specification. In turn, each TAP controller controls the test-logic (e.g., boundary scan testing) or the debug features of an associated IP core. In accordance with the present invention, no additional controllers (e.g., top-level TAP, hierarchical TAP, Master TAP, or TAP Linking Module) and no additional pins are needed to force a particular mode of operation on the chip. Embodiments of the present invention are programmable through, for example, the standard JTAG ports. Embodiments of the present invention are particularly useful in situations where the design of the TAP controllers and the IP cores are done separately, or at different points in time. Some embodiments of the present invention advantageously provide a modular, scalable approach to integrating multiple TAP controllers into a SoC.

To understand the context of the present invention, refer to FIG. 1, and consider that an IP integrator wishes to put two or more IP cores on one SoC. The IP cores could be processors, DSPs, highly integrated functional blocks, or any combination of the foregoing.

Assume that each of these IP cores has a TAP controller and an associated JTAG module arranged in such a way that this TAP-JTAG combination forms an IEEE 1149.1 compliant device if it were on a chip by itself. A straightforward implementation for observing the two IP cores through a JTAG interface would use logical gating, multiplexing, and a "mode" pin as shown in FIG. 1.

Referring to FIG. 1, assume that TAP1 102 is the default TAP controller and that the mode signal received from a mode pin 104 is set to zero at start-up. Note that both the TDI and TMS inputs to TAP1 102 and TAP2 106 are logically gated such that when the mode signal is a logical zero, TAP1 102 receives the actual TDI and TMS signals while TAP2 106 receives zeroes for those inputs; and when the mode signal is a logical one, TAP2 106 receives the actual TDI and TMS signals while TAP1 102 receives zeroes for those inputs. The physical implementation of such logic circuitry is a matter well understood by those skilled in the art. It is noted that the only output from either TAP1 102 or TAP2 106 is TDO. The other pins of TAP controllers 102, 106 are inputs. It is also noted that the finite state machine (FSM) of the TAP controllers 102, 106 will default to the Run-Test-Idle state within five cycles of the clock signal received on the TCK pin if the signal received from the TMS pin is zero. The TDI, TCK, TRSTN signals may be freely shared among TAP controllers 102, 106 (but TDI in addition to TMS are logically gated as shown in FIG. 1).

The TDO outputs are multiplexed by a 2-to-1 multiplexer 108, as are the two enable signals (not shown) for the tri-state buffer associated with the TDO outputs. It is not an uncommon practice that the TAP controller, JTAG module, and IP core are designed separately, and at different points in time. The IP integrator has the task to connect the standardized interfaces properly.

Figure 2:
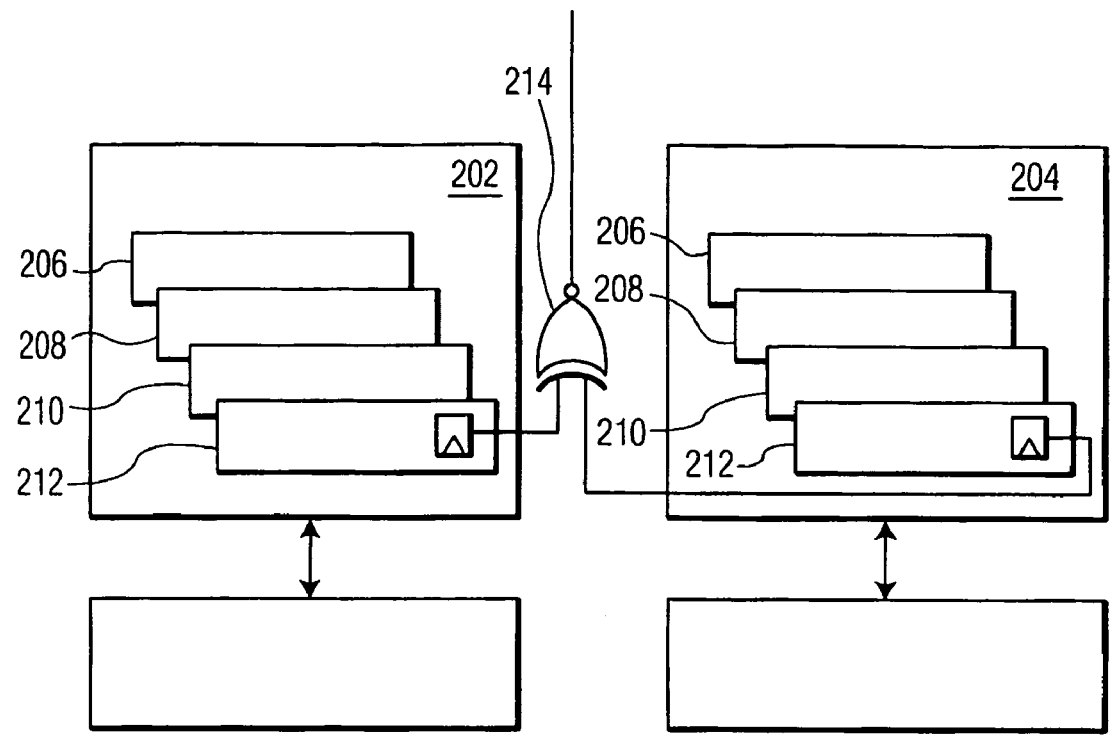
FIG. 2 is a high level block diagram of a SoC that includes a pair of IP cores, each having an associated switch register in accordance with the present invention, and the logic for internally generating a signal used in switching between each of the pair of IP cores for test access.

Referring to FIG. 2, assume that each JTAG module 202, 204 contains several JTAG registers, such as, for example, an instruction register 206, a bypass register 208, and an IDCODE register 210. The IEEE 1149.1 standard allows extending JTAG modules 202, 204 by user-defined data registers. In various embodiments of the present invention, a one bit data register 212 is added to at least the default TAP controller. Such a one bit data register is referred to herein as the switch register 212. FIG. 2 shows a switch register 212 incorporated into each of the two JTAG modules 202, 204 of this illustrative embodiment of the present invention. The outputs of each of the one bit switch registers 212 are coupled to an XOR gate 214 to produce the mode signal that controls the logical gating and multiplexing shown in FIG. 1. That is, the mode signal which is produced within the integrated circuit, in accordance with the present invention, replaces the externally supplied mode signal, and corresponding mode pin, shown in FIG. 1.

In accordance with the present invention, the two TAP controllers will appear to be one TAP controller to an off-chip observer, such as a JTAG probe. This is because the state that updates a data register transitions into the Run-Test-Idle state with one more high-level value on TMS during a TCK clock edge. While the probe is negotiating the JTAG protocol, the hardware reconfigures itself and a different TAP controller is connected to the external interface pins of the SoC. The fact that the protocol can be used during this particular state transition for the purpose of changing the connections of the TAP controllers themselves is used by embodiments of the present invention.

The nature of JTAG operations is that a new value is shifted into a register while, typically, the old value is shifted out and captured off-chip. In some cases a different value is shifted out, for example, when shifting in a new instruction. In order to have a uniform predictable switching mechanism across multiple JTAG modules, it is desirable that a JTAG probe should not be required to keep track of the current values for different switch registers 212. Therefore, in an embodiment of the present invention, the content of switch register 212 is inverted when shifting in a logical one. So regardless of the current values of both switch registers 212, if exactly one input is inverted, the mode signal will switch. Such an arrangement is suitable for embodiments of the present invention in which two TAP controllers are integrated in a single chip.

Figure 3:
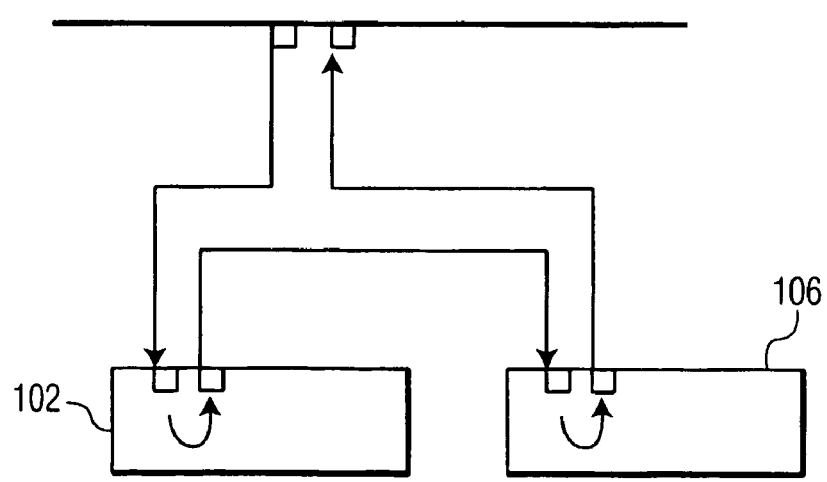
FIG. 3 is a high-level schematic block diagram of a SoC having a pair of TAP controllers illustrating the daisy chained data flow therebetween, in accordance with the present invention.
Figure 4:
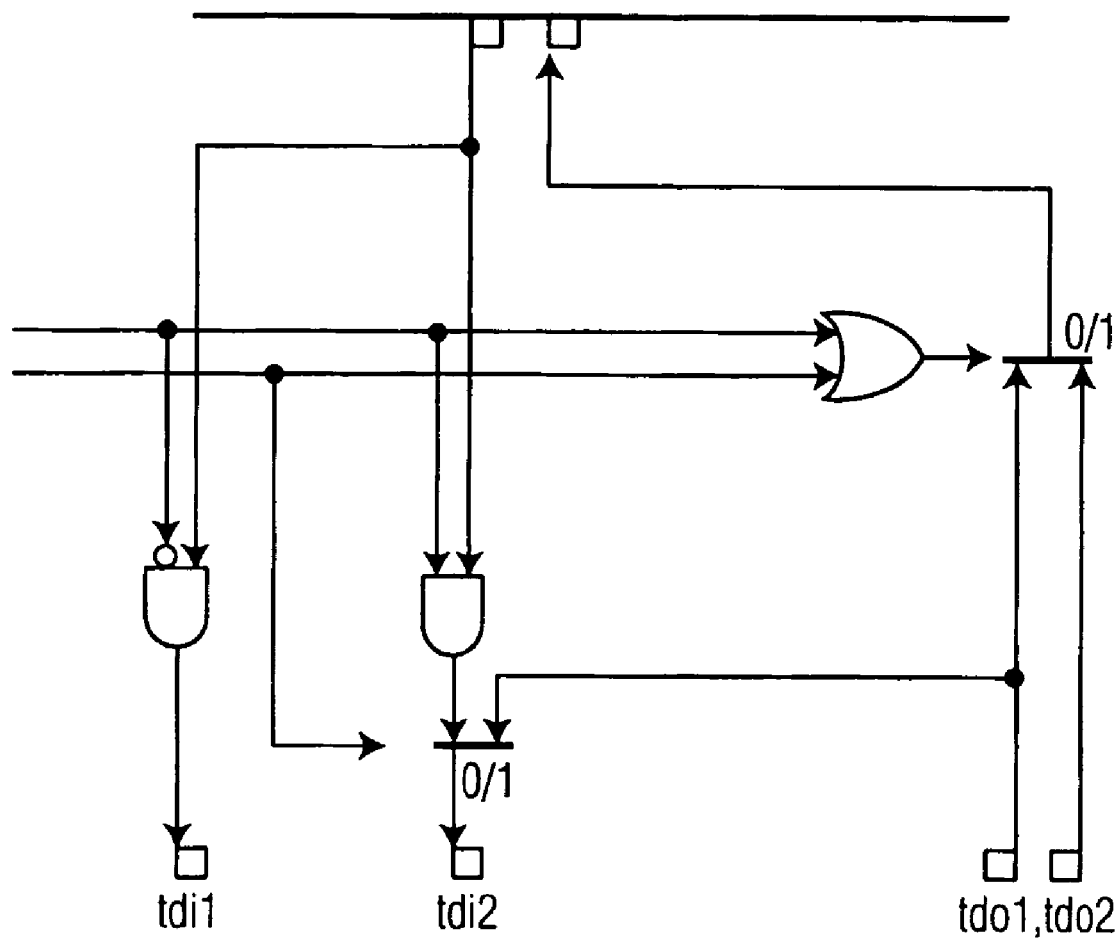
FIG. 4 is a schematic diagram of logic for implementing the daisy chained data flow illustrated in FIG. 3, and the switching mechanism based on the mode signal.
Figure 5:
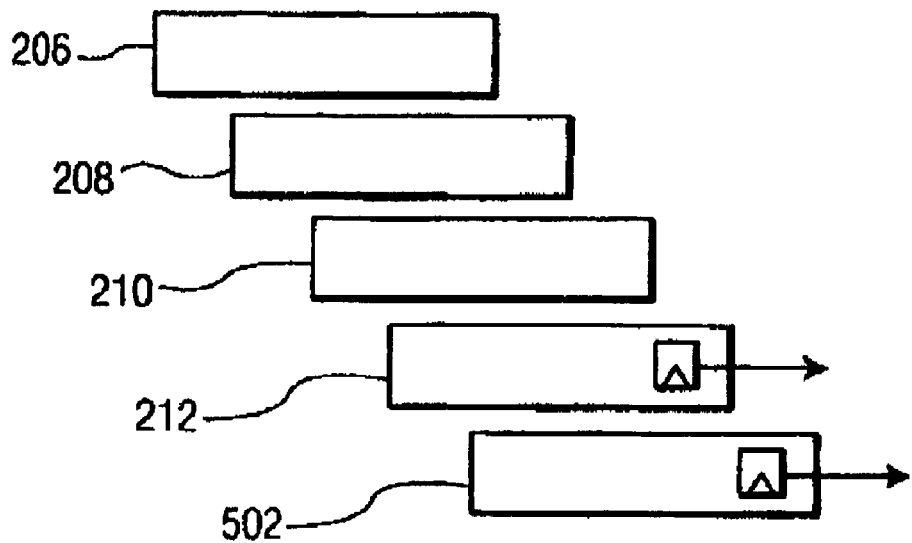
FIG. 5 is a high-level schematic block diagram of showing conventional JTAG registers along with the switch register and chain register of the present invention.

Given that it is possible, in accordance with the invention, to switch back and forth between two TAP controllers, it is further desirable to provide for daisy chaining of the TAP controllers. In one illustrative embodiment of daisy chaining, as shown in FIGS. 3 and 4, the technique shown in FIG. 2 is extended to provide the data-flow associated daisy chaining. More particularly, the general data flow associated with daisy chaining is shown in FIG. 3 by only presenting the flow from TDI to TDO. To accomplish daisy chaining in accordance with the present invention, a TAP controller (e.g., TAP1 102) is further extended by a one bit data register, referred to hereafter as the chain register. FIG. 5 illustrates the conventional instruction, bypass, and IDCODE JTAG registers 206, 208, 210, and the switch and chain registers 212, 502 of the present invention.

It is noted that although it is possible to add chain bits to more than one of the plurality of TAP controllers on a single integrated circuit in accordance with the present invention, this increases the complexity of the combinational logic that is required for control. It will be appreciated that those skilled in the art and having the benefit of this disclosure can readily synthesize such control logic and therefore those details are not described further.

As indicated in FIG. 4, the chain signal can now be used in addition to the mode signal to implement appropriate logical gating and multiplexing for TDI1, TDI2, TDO1 and TDO2. Assuming that mode=0 when chain=1, then FIG. 4 is logically equivalent to FIG. 3. It will be appreciated that this is an illustrative embodiment of the present invention, and that the exemplary logic may be different if the value of the mode signal, for example, is chosen to be different. This is well-understood by those skilled in the art.

Figure 6:
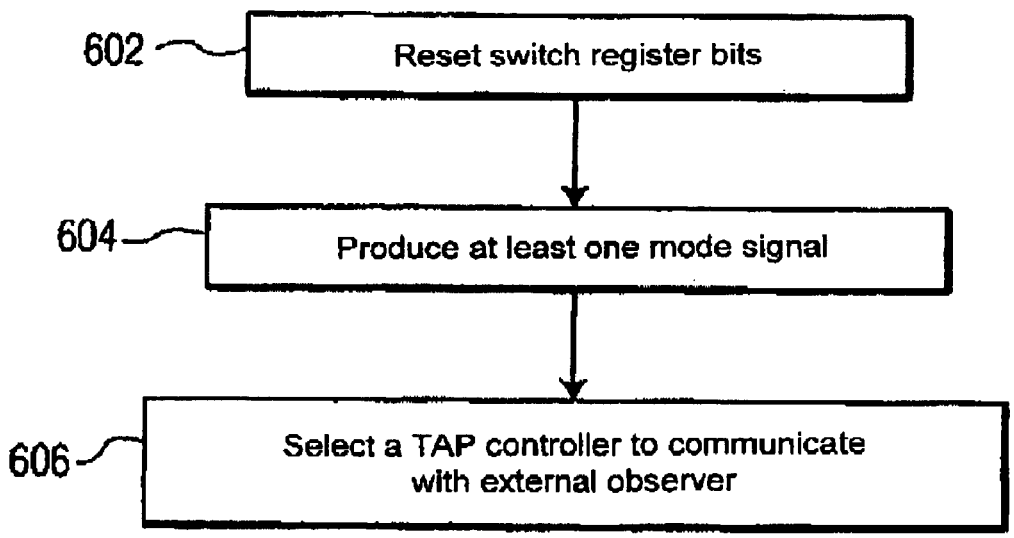
FIG. 6 is a flowchart of an illustrative process in accordance with the present invention.

FIG. 6 illustrates a process flow in accordance with the present invention. Switch register bits in two or more TAP controllers are reset 602 to a known state. A logical combination of the outputs of the switch register bits in their reset state controls which of the TAP controllers can be accessed by an external observer. Subsequently, writing to the switch register bit of the selected TAP controller results in that bit toggling (i.e., having its current state inverted). The new state of the switch register bits is used to produce, or derive, 604 at least one mode signal. Based at least in part on the state of the mode signal(s), a next TAP controller is selected 606 for communication with the external observer. In the case of two TAP controllers, the mode signal always selects one of the two TAP controllers.

In order to scale beyond two TAP controllers a mode bus may be derived, such that a changing value in any switch-register causes the next scheduled TAP controller to be selected. Such examples are described in greater detail below.

In the following section an illustrative embodiment having three TAP controllers (referred to as TAP1, TAP2, and TAP3) is described. Each TAP controller has a 1-bit switch register that resets to zero. Instead of using a single XOR to make the mode bit (as described above in connection with the example having two TAP controllers), a mode bus is used.

With respect to switching between TAP1, TAP2, and TAP 3, assume a round-robin scheduling algorithm is implemented to provide access between all the TAP controllers. (It is noted that selecting one out of many TAPs is a different function than chaining, and each of these functions is desirable for different purposes. Various embodiments of the present invention support both selecting and chaining.) In this illustrative embodiment TAP1 is selected by default, and when the switch register of a selected TAP controller is written, a next controller is selected, for example: TAP1->TAP2->TAP3->TAP1 and so on. The mode-bus has a width corresponding to ceiling[log 2(#TAPs)], which, in this illustrative embodiment, amounts to two bits, and those two bits may be defined as shown in TABLE 1.

TABLE 1

| mode[1:0] | selected TAP |
| --- | --- |
| 00 | TAP1 |
| 01 | TAP2 |
| 10 | TAP3 |
| 11 | not used |

The logic for the mode-bus is solely dependent on the value of the three switch register bits, S1, S2 and S3, as shown in TABLE 2.

TABLE 2

| inputs | | | select, mode output | Operation in this mode: |
| --- | --- | --- | --- | --- |
| S3 | S2 | S1 | | |
| 0 | 0 | 0 | TAP, 00 | S1 switch makes input = 001 |
| 0 | 0 | 1 | TAP2, 01 | S2 switch makes input = 011 |
| 0 | 1 | 1 | TAP3, 10 | S3 switch makes input = 111 |
| 1 | 1 | 1 | TAP1, 00 | S1 switch makes input = 110 |
| 1 | 1 | 0 | TAP2, 01 | S2 switch makes input = 10 |
| 1 | 0 | 0 | TAP3, 10 | S3 switch makes input = 000 |
| others | | | not used | remaining input combinations not used |

In this illustrative embodiment, the TDI and TMS inputs are gated by a 3-input AND gate (see TABLE 1). Two of the inputs are the mode[1] and mode[0] bits, with some inverting, such that only the selected TAP controller receives a TDI or TMS signal from the top-level pins. Similarly, the three TDO signals are multiplexed using the mode[1:0] bits such that only the selected TAP controller provides a TDO signal to the top-level pins. Various well-known circuits can be used to implement the foregoing logic and multiplexing. The input-output table (see TABLE 2) for the mode-bus can be easily synthesized and yields an relatively small number of logic gates.

In the following section an illustrative embodiment having four TAP controllers (referred to as TAP1 to TAP4 in this example) is described.

With respect to switching between the various TAP controllers, assume round-robin scheduling is implemented between all TAP controllers. In this illustrative embodiment TAP1 is selected by default. When the switch register of the selected TAP controller is written, a next controller is selected, for example: TAP1->TAP2->TAP3->TAP4->TAP1 and so on.

In the illustrative embodiment the mode-bus has a width corresponding to ceiling[log 2(#TAPs)] (which still amounts to two bits), and the mode bits are defined in TABLE 3.

TABLE 3

| mode[1:0] | selected TAP | selected TDO (mode-bus is input to 4-to-1 mux) |
|---|---|---|
| "00" | TAP1 | tdo1 |
| "01" | TAP2 | tdo2 |
| "10" | TAP3 | tdo3 |
| "11" | TAP4 | tdo4 |

The logic for the mode-bus is solely dependent on the value of the four switch register bits, S1, S2, S3 and S4, as shown in TABLE 4.

TABLE 4

| inputs | S4 | S3 | S2 | S1 | select, mode output | Operation in this mode |
|---|---|---|---|---|---|---|
| | 0 | 0 | 0 | 0 | TAP1, 00 | S1 switch makes input = 0001 |
| | 0 | 0 | 0 | 1 | TAP2, 01 | S2 switch makes input = 0011 |
| | 0 | 0 | 1 | 1 | TAP3, 10 | S3 switch makes input = 0111 |
| | 0 | 1 | 1 | 1 | TAP4, 11 | S4 switch makes input = 1111 |
| | 1 | 1 | 1 | 1 | TAP1, 00 | S1 switch makes input = 1110 |
| | 1 | 1 | 1 | 0 | TAP2, 01 | S2 switch makes input = 1100 |
| | 1 | 1 | 0 | 0 | TAP3, 10 | S3 switch makes input = 1000 |
| | 1 | 0 | 0 | 0 | TAP4, 11 | S4 switch makes input = 0000 |
| | others | | | | not used | remaining input states not used |

It is noted that there are a number of unused input combinations (also referred to as input states).

In this illustrative embodiment, the TDI and TMS inputs are gated by a 3-input AND gate (see TABLE 3). Two of the inputs are the mode[1] and mode[0] bits, with some inverting, such that only the selected TAP controller receives a TDI or TMS signal from the top-level pins. Similarly, the four TDO signals are multiplexed using the mode[1:0] bits such that only the selected TAP controller provides a TDO signal to the top-level pins. Various well-known circuits can be used to implement the foregoing logic and multiplexing.

If more TAP controllers are to be used, then the number of mode bits grows with log 2 rate. That is, three mode bits are sufficient for up to eight TAP controllers, four bits are sufficient up to sixteen TAP controllers and so on. The number of defined and used input states also grows slowly, only by two states per added TAP controller.

With respect to chaining between the various TAP controllers, rather than switching as described above, the following changes are needed: every TDI in a chain is configured to receive its signal from two sources, namely: (1) the top-level TDI pin in case it is the TDI of the selected TAP controller, or, the TDO-signal from the preceding TAP controller in case of chaining. There are small provisions at the beginning and the end of the chain, but the complexity does not grow with the addition of more TAP controllers. For example, even with a chain containing ten TAP controllers, the TDI for any TAP controller in the chain can still only come from two possible sources, which are, as noted above: (1) the top-level TDI for the case of being the TDI of the selected controller, or, (2) from the TDO signal of the preceding TAP controller for the case of being a TDI of a daisy-chained TAP controller. Similarly, in this illustrative example, the TDO pin is either driven by an individual selected TAP controller (using an n-to-1 multiplexer), or, if all TAP controllers are daisy-chained, the TDO is driven by the TDO-signal from the last TAP in the chain.

Embodiments of the present invention may use scheduling algorithms other than round-robin, although there are some complexity issues in making the target of a switch programmable. In such a scenario, the state of the system may be stored in every TAP controller, or in a central place. This is different from the above-described illustrative embodiments wherein the state is encoded in the combined switch/chain bits of the data registers in the TAP controllers.

CONCLUSION

Multiple test access port (TAP) controllers on a single chip are accessed, in accordance with the IEEE 1149 specification by maintaining the appearance of having only a single test access port to an outside observer. By adding a single bit to a data register of each of a plurality of TAP controllers, along with straightforward combinational glue logic, the plurality of TAP controllers can be accessed without the need for additional chip pins, and without the need for additional TAP controllers. By adding a second bit to at least one of the TAP controllers, internal derivation of signals suitable for controlling desirable functionality of the plurality of TAP controllers can be achieved. Toggling the state of the added bits in the respective data registers of the plurality of TAP controllers provides the control information for either switching or daisy-chaining of the plurality of TAP controllers.

It is to be understood that the present invention is not limited to the embodiments described above, but encompasses any and all embodiments within the scope of the subjoined claims.

What is claimed is:

1. A method of coupling a plurality of test access port (TAP) controllers to a single external interface, comprising:
    a) resetting a first bit in each of a plurality of TAP controllers to a known state;
    b) producing a first signal based, at least in part, on the state of the first bit in each of the plurality of TAP controllers;
    c) selecting one of the plurality of TAP controllers based, at least in part, on the first signal;
    d) coupling an external input terminal to an input terminal of the selected one of the plurality of TAP controllers; and
    e) coupling an output terminal of the selected one of the plurality of TAP controllers to an external output terminal.

2. The method of claim 1, wherein the TAP controller comprises a finite state machine and a plurality of registers.

3. The method of claim 2, further comprising entering a run-test-idle state by toggling the first bit in the selected one of the plurality of TAP controllers; and
    while in the run-test-idle state,
        selecting a second one of the plurality of TAP controllers based on the state of the first bit in each of the plurality of TAP controllers;
        coupling the external input terminal to an input terminal of the second TAP controller; and
        coupling an output terminal of the second TAP controller to the external output terminal.

4. The method of claim 3, further comprising providing a clock signal, a test mode selection signal, and a test reset signal to each of the plurality of TAP controllers.

5. The method of claim 3, wherein the plurality of TAP controllers are disposed on a single integrated circuit.

6. The method of claim 5, wherein the first signal is produced within the single integrated circuit.

7. The method of claim 6, further comprising receiving, from a source external to the single integrated circuit, a clock signal.

8. An integrated circuit, comprising:
a plurality of functional blocks, each functional block having a test access port (TAP) controller coupled thereto;
each TAP controller including a first register bit, each first register bit adapted to produce a known output state in response to a reset signal, each first register bit further adapted to toggle in response to a register write operation; and
routing logic adapted to selectively provide, based at least in part on the state of the plurality of first register bits, a communication path between an external input signal source and an input terminal of a selected one of the TAP controllers, the routing logic further adapted to provide, in response to toggling of the first register bit in the selected TAP controller and based on the state of each of the first register bits, a communication path between the external input signal source and an input terminal of a second one of the TAP controllers.

9. The integrated circuit of claim 8, wherein the routing logic is further adapted to selectively provide, based at least in part on the state of the plurality of first register bits, a communication path between an external output terminal and an output terminal of the selected TAP controllers, and the routing logic is further adapted to provide, in response to the toggling of the first register bit in the selected TAP controller and based on the state of each of the first register bits, a communication path between the external output terminal and an output terminal of the second TAP controller.

10. The integrated circuit of claim 9, wherein a transition between the selectively provided communication paths is transparent to an external observer.

11. The integrated circuit of claim 8, wherein at least one TAP controller further includes a second register bit; wherein the routing logic is further adapted to provide the output of a first TAP controller as an input to a second TAP controller, based at least in part on the state of the first and second register bits.

12. An integrated circuit (IC), comprising:
a plurality of test access port (TAP) controllers disposed on the IC, each of the plurality of TAP controllers having a first input terminal adapted to receive a data input signal and an output terminal adapted to provide a data output signal, each of the plurality of TAP controllers further having at least one switch bit;
a first interface to receive an externally supplied input signal;
a second interface to transmit an internally generated output signal; and
routing logic adapted to selectively provide, based at least in part on the state of the switch bits of the plurality of TAP controllers, a first communication path between the input terminal of a predetermined one of the plurality of TAP controllers and the first interface, and a second communication path between the output terminal and the second interface.

13. The integrated circuit of claim 12, further comprising a plurality of functional blocks coupled respectively to each of the plurality of TAP controllers, wherein the routing logic is further adapted to provide, in response to toggling of the switch bit in the predetermined TAP controller and based on the state of each of the switch bits, a first communication path between the input terminal of a second one of the plurality of TAP controllers and the first interface, and a second communication path between the output terminal of the second TAP controller and the second interface.

14. The integrated circuit of claim 13, wherein the each of the plurality of TAP controllers has a second input terminal adapted to receive a clock signal, a third input terminal adapted to receive mode select signal, and a fourth input terminal adapted to receive a reset signal; wherein the plurality of second input terminals are coupled in common, the plurality of third input terminals are coupled in common, and the plurality of fourth input terminals are coupled in common.

15. The integrated circuit of claim 14, further comprising a chain bit disposed in a first one of the plurality of TAP controllers.

* * * * *